(12) United States Patent
Chung et al.

(10) Patent No.: US 6,784,703 B1
(45) Date of Patent: Aug. 31, 2004

(54) DYNAMIC DRIVER BOOST CIRCUITS

(75) Inventors: Jason Chung, Williston, VT (US);
Hongfei Wu, Colchester, VT (US);
Songtao Xu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,175

(22) Filed: Jun. 30, 2003

(51) Int. Cl.[7] .................................................. H03B 1/00
(52) U.S. Cl. ...................................................... 327/112
(58) Field of Search ................................ 327/108, 112, 327/170, 379–380, 389, 391, 312, 318, 328; 326/27, 82–85, 87, 91

(56) References Cited

U.S. PATENT DOCUMENTS

| | | | |
|---|---|---|---|
| 5,717,343 A | * | 2/1998 | Kwong ........................ 326/27 |
| 5,889,707 A | * | 3/1999 | Yang ...................... 365/189.05 |
| 6,130,563 A | * | 10/2000 | Pilling et al. ................ 327/111 |
| 6,384,644 B2 | * | 5/2002 | Yamazaki .................... 327/112 |
| 6,466,063 B2 | * | 10/2002 | Chen .......................... 327/112 |
| 6,525,576 B2 | * | 2/2003 | Kawano et al. ............. 327/112 |

* cited by examiner

*Primary Examiner*—My-Trang Nuton
(74) *Attorney, Agent, or Firm*—McGinn & Gibb, PLLC; Richard A. Henkler, Esq.

(57) ABSTRACT

In order to reduce slew rate and minimize delay skew, the invention adds a pull-down booster circuit connected to the gate of the driving transistor and/or a pull-up booster circuit connected the gate of the driving transistor. The pull-down booster circuit is adapted to dynamically pull-down the voltage at the gate of the driving transistor when the voltage level at the input to the logical enable device changes from a first voltage (e.g., a logical "0") to a second voltage (e.g., a logical "1"). The pull-up booster circuit is adapted to dynamically pull-up the voltage at the gate of the driving transistor when the voltage level at the input to the logical enable device changes from the second voltage to the first voltage.

38 Claims, 6 Drawing Sheets

DYNAMIC DRIVER BOOST CIRCUITS

BACKGROUND OF INVENTION

1. Field of the Invention

The present invention generally relates to driver circuits and more particularly to improved pull-up and pull down boost circuitry for drivers that minimizes block delay skew.

2. Description of the Related Art

As technology advances, device sizes get smaller. Likewise, maximum operating voltages decrease with each new technology. With smaller device sizes and a lower VDD, it becomes very difficult to improve block delay and reduce di/dt while still maintaining appropriate slew rates and keeping the design within the specifications. This invention tightens the slew rate and also minimizes block delay skew and jitter across different PVT conditions.

SUMMARY OF INVENTION

The invention begins with a driver circuit that includes a logical enable device and a driving transistor. In order to tighten slew rate and minimize delay skew, the invention adds a pull-down booster circuit connected to the gate of the driving transistor and/or a pull-up booster circuit connected to the gate of the driving transistor. The pull-down booster circuit is adapted to kly start pulling down the voltage at the gate of the driving transistor when the voltage level at the input to the logical enable device changes from a first voltage (e.g., a logical "0") to a second higher voltage (e.g., a logical "1"). The pull-down booster than dynamically shuts itself off when the voltage level at feedback node G (the gate of the driving transistor) changes from a first voltage (e.g., a logical 1) to a second lower voltage (e.g. a logical 0). The voltage level at feedback node G (the gate of the driving transistor) only needs to fall to a threshold voltage below the voltage supply to start shutting off the pull-down booster. Thus, the stronger the pull-down booster circuit is, the faster it will shut itself off. This is why the pull-down boost circuit can be considered dynamic and sensitive to different process, temperature and voltage conditions. After the pull-down booster shuts off, the voltage level at the gate of the driving transistor is controlled by the logical enable device which controls the slew rate and di/dt by utilizing resistors in series with the CMOS FETS. By using only the resistors to control di/dt and slew rates, the circuit is adversely affected in terms of delay. By using the boost circuit in combination with the resistors, the invention is able to get a balance of delay, slew rate control, reduced di/dt, and less overshoot/undershoot voltage at the PAD. The pull-up booster circuit is adapted to dynamically pull-up the voltage at the gate of the driving transistor when the voltage level at the input to the logical enable device changes in the opposite direction.

The pull-down booster circuit has a logical NAND device having one input connected to an input signal supplied to the logical enable device. The pull-down booster circuit also includes a pull-down transistor that has its gate connected to the output of the NAND device, a source connected to the output of the logical enable device (and the gate of the driving transistor), and a drain connected to ground. The second input of the logical NAND device is connected to the output of the logical enable device, such that the logical NAND device dynamically activates the pull-down transistor to pull-down the gate of the driving transistor to ground (e.g., a logical "0") only while the input signal supplied to the logical enable device is at the second voltage level (e.g., a logical "1") and the signal on the output of the logical enable device (and the gate of the driving transistor) is also at the second voltage level (e.g., a logical "1").

The pull-up booster circuit has a logical NOR device having one input connected to the input signal supplied to the logical enable device. The pull-up booster circuit also includes a pull-up transistor that has its gate connected to an output of the NOR device, a drain connected to an output of the logical enable device (and the gate of the driving transistor), and a source connected to the higher voltage level. The second input of the logical NOR device is connected to the output of the logical enable device (and the gate of the driving transistor), such that the logical NOR device activates the pull-up transistor to pull-up the gate of the driving transistor to the higher voltage level (e.g., a logical "1") only while the input signal is at the second voltage level (e.g., a logical "0") and the signal on the output of the logical enable device (and the gate of the driving transistor) is also at the second voltage level (e.g., a logical "0").

The invention can also provide at least one pull-down delay element between the logical NAND device and the pull-down transistor and at least one pull-up delay element between the logical NOR device and the pull-up transistor. The pull-down delay element is connected in parallel with the signal line running between the logical NAND device and the pull-down transistor. The pull-up delay element is similarly connected in parallel with the signal line running between the logical NOR device and the pull-up transistor. This parallel arrangement provides that the delays created by the pull-down delay element and the pull-up delay element are dynamically varied depending upon the difference between the voltage level at the input to the logical enable device and the voltage level at the gate of the driving transistor.

If the pull-down transistor comprises a P-type transistor, it is directly connected to the logical NAND device. Similarly, if the pull-up transistor comprises an N-type transistor, it is also directly connected to the logical NOR device. Otherwise, if the pull-down transistor comprises an N-type transistor, the circuit further includes an inverter positioned between the logical NAND device and the pull-up transistor. Similarly, if the pull-up transistor comprises a P-type transistor, the circuit further includes an inverter positioned between the logical NOR device and the pull-up transistor.

BRIEF DESCRIPTION OF DRAWINGS

The invention will be better understood from the following detailed description of preferred embodiments with reference to the drawings, in which.

DETAILED DESCRIPTION

Figure 1:
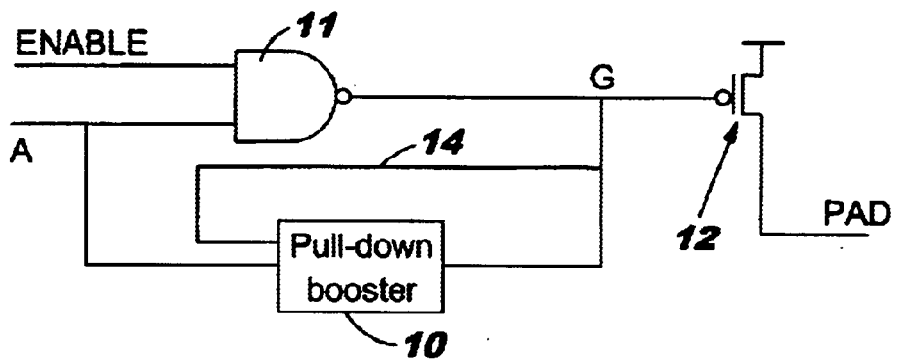
FIG. 1 is a schematic diagram of a driver circuit that utilizes a pull-down booster according to the invention.

As mentioned above, there is a need to tighten the slew rate and also minimize block delay skew and jitter in driver devices. In order to reduce slew rate and minimize delay skew, the invention adds a pull-down booster circuit connected to the gate of the driving transistor and/or a pull-up booster circuit connected the gate of the driving transistor. As shown in FIG. 1, the driver circuit includes a logical enable device 11 (such as a NAND logic circuit) and a driving transistor 12 such as a P-type transistor. The pull-down booster circuit 10 is adapted to dynamically pull-down the voltage at the gate of the driving transistor 12 when the voltage level at the input to the logical enable device 11 changes from a logical "0" to a logical "1". Feedback loop 14 provides dynamic feedback to the pull-down booster 10 from node G. The pull-down circuit 10 in FIG. 1 will increase the speed with which the transistor 12 turns on, thus decreasing the output rise delay.

Figure 2:
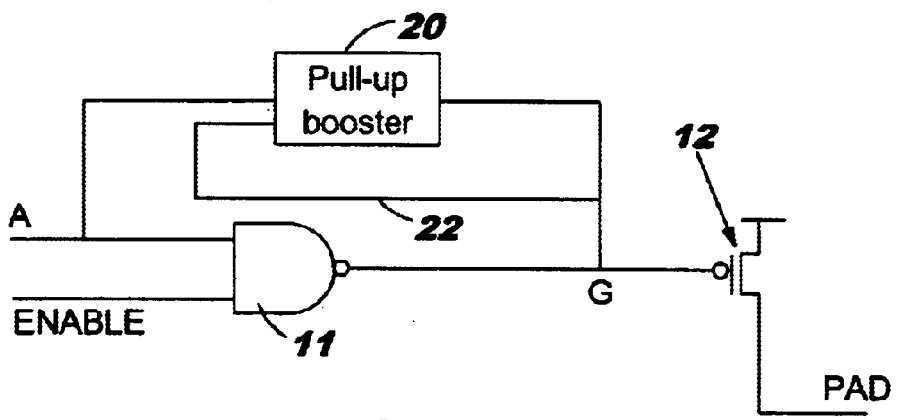
FIG. 2 is a schematic diagram of a driver circuit that utilizes a pull-up booster according to the invention.

Similarly, as shown in FIG. 2, the pull-up booster circuit 20 is adapted to dynamically pull-up the voltage at the gate of the driving transistor 12 when the voltage level at the input to the logical enable device 11 changes from a logical "1" to a logical "0". Feedback loop 22 provides dynamic feedback to the pull-up booster 20 from node G. The pull-up circuit 20 in FIG. 2 will increase the speed with which the transistor turns off, thus decreasing the output fall delay.

Figure 3:
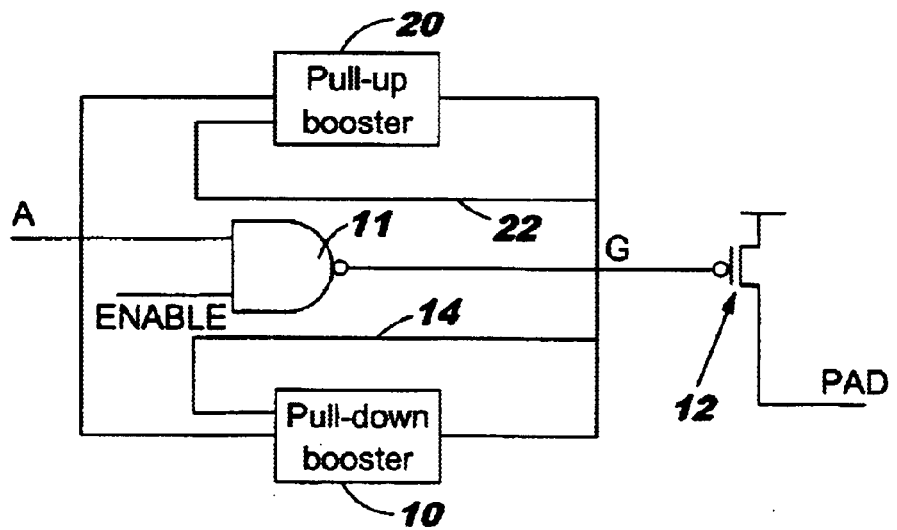
FIG. 3 is a schematic diagram of a driver circuit that utilizes a pull-down booster and a pull-up booster according to the invention.

FIG. 3 illustrates that the driver circuit can be equipped with both a pull-up booster 20 and a pull-down booster 10 to further reduce delay skew and slew rate. The circuit in FIG. 3 has both a pull-up boost circuit and a pull-down boost circuit which will decrease both rise and fall delays. The pull-up boost and the pull-down boost will never be enabled at the same time.

Figure 4:
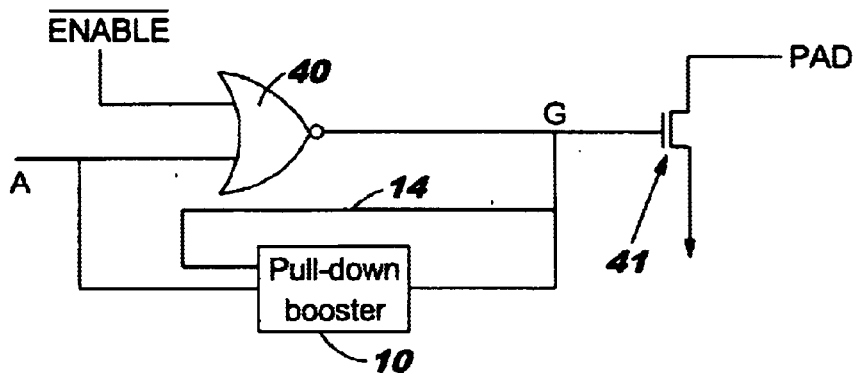
FIG. 4 is a schematic diagram of a driver circuit that utilizes a pull-down booster according to the invention.
Figure 5:
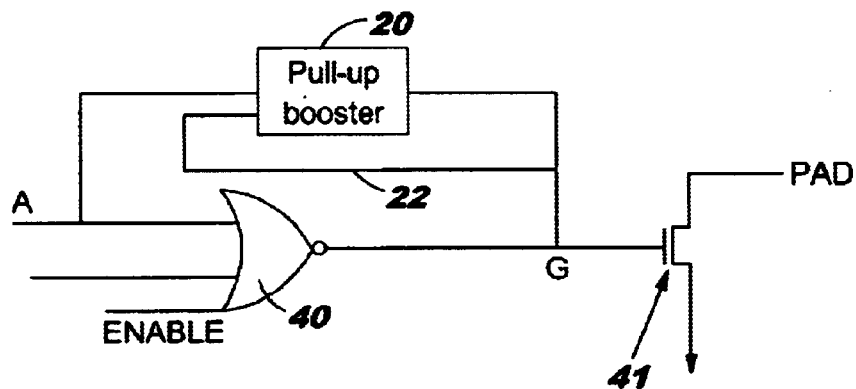
FIG. 5 is a schematic diagram of a driver circuit that utilizes a pull-up booster according to the invention.
Figure 6:
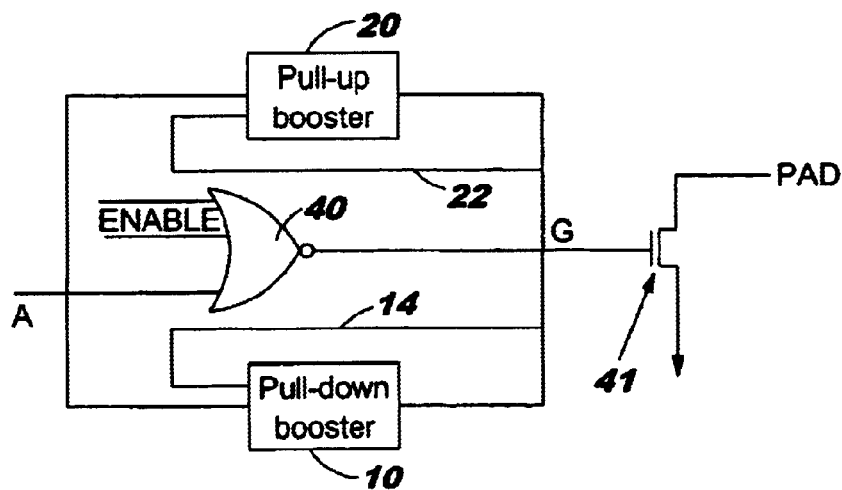
FIG. 6 is a schematic diagram of a driver circuit that utilizes a pull-down booster and a pull-up booster according to the invention.
Figure 7:
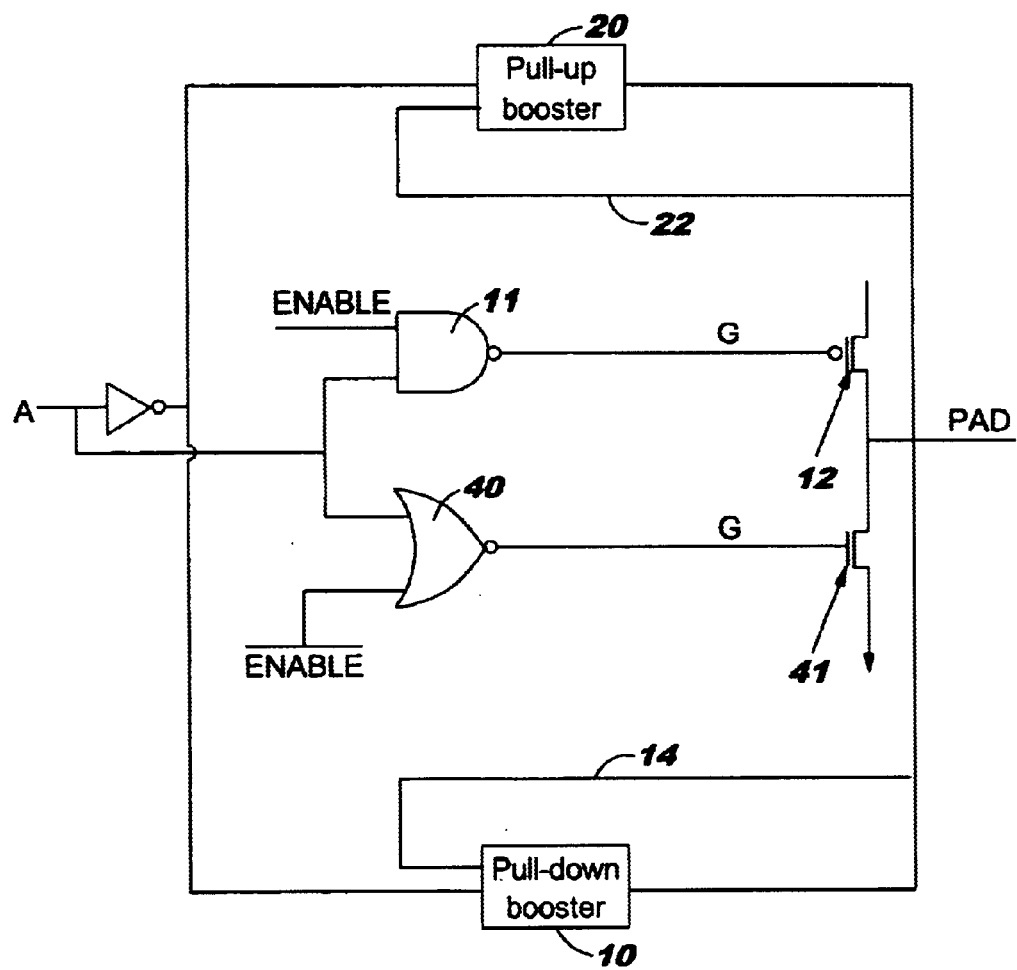
FIG. 7 is a schematic diagram of a driver with dynamic feedback and a pull-up booster and pull-down booster according to the invention.

While FIGS. 1–3 relate to a predriver logic circuit that utilizes a P-type field effect transistor (PFET), FIGS. 4–6 relate to a predrive logic circuit that utilizes an N-type field effect transistor (NFET). More specifically, FIGS. 4–6 illustrate that the inventive pull-down booster circuit 10 and pull-up booster circuit 20 can also be utilized with a logical enable device 40 (such as a NOR circuit) when the driving transistor 41 is an N-type transistor. As mentioned with respect to FIGS. 1–3, the predriver logic can include either the pull-down booster 10 (FIG. 4), the pull-up booster 20 (FIG. 5) or both the pull-up booster 20 and the pull-down booster 10 (FIG. 6). FIG. 7 demonstrates that the inventive pull-down booster circuit 10 and pull-up booster circuit 20 can also be utilized to dynamically boost the output of the PAD in a feedback structure that includes both the NFET and PFET devices.

More details regarding the pull-down booster circuit 10 are shown in FIGS. 8–11 and more details regarding the pull-up booster circuit 20 are shown in FIGS. 12–15, which are discussed in greater detail below.

Figure 8:
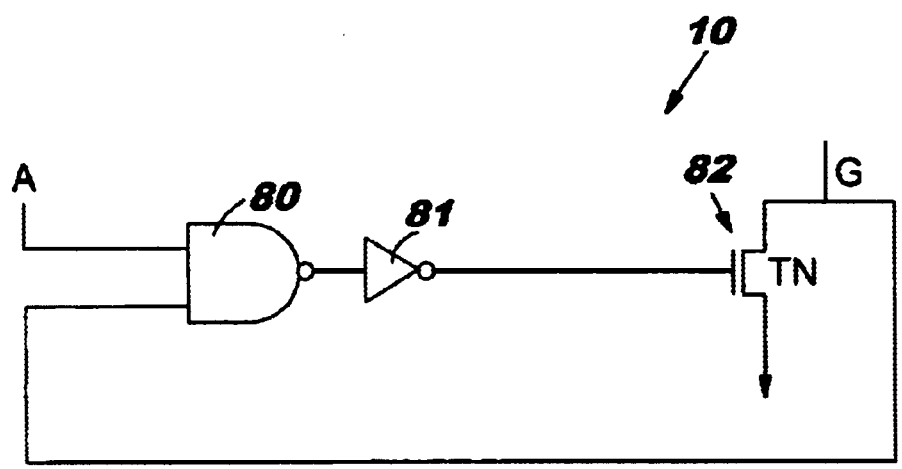
FIG. 8 is a schematic diagram of a pull-down booster according to the invention.

As shown in FIG. 8, one embodiment of the pull-down booster circuit 10 has a logical NAND device 80 having one input connected to an input signal A supplied to the logical enable device 11, 40. The pull-down booster circuit 10 also includes a pull-down transistor that has its gate connected to the output of the NAND device 80, a source connected to the output of the logical enable device G (and the gate of the driving transistor 12, 41), and a drain connected to ground.

The present invention improves block delay by immediately providing a boost as soon as driver input A switches from a first voltage to a second voltage (from high to low or from low to high, depending upon specific circuit design). The boost circuit dynamically shuts off as soon as predrive output G has risen/fallen. More specifically, the second input of the logical NAND device 80 is connected to the gate of the driving transistor 12, 41 (G), such that the logical NAND device 80 dynamically activates the pull-down transistor to pull-down the gate of the driving transistor 12, 41 to ground (e.g., a logical "0") only while the input signal A supplied to the logical enable device 11, 40 is at the second voltage level (e.g., a logical "1") and the signal on the output of the logical enable device 11, 40 G (and the gate of the driving transistors 2, 41) is also at the same second voltage level (e.g., a logical "1") such that they are at the same logic level. Initially A=0, G=1 which means that the pull-down transistor is off. When input A switches from a logic "0" to a logic "1" (from low voltage to high voltage), there is a short period of time when A=1 and G=1. During this short period of time, the pull-down transistor is on and the pull-down transistor helps pull G down to logic "0". When G becomes a "0", the pull-down transistor turns off and the boost circuit is finished boosting.

Figure 9:
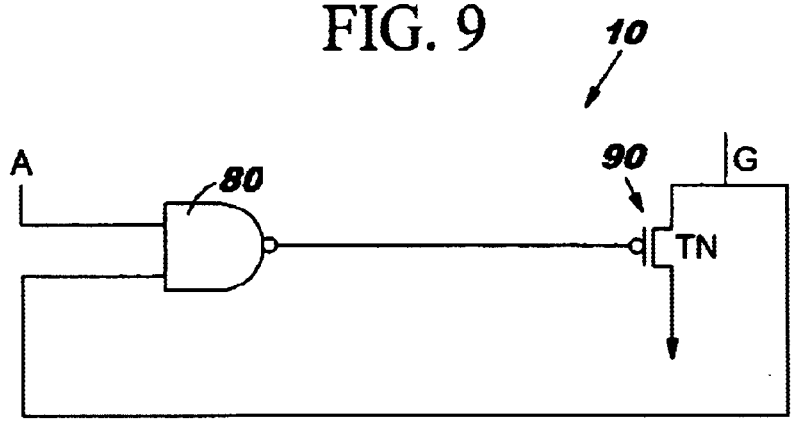
FIG. 9 is a schematic diagram of a pull-down booster according to the invention.
Figure 10:
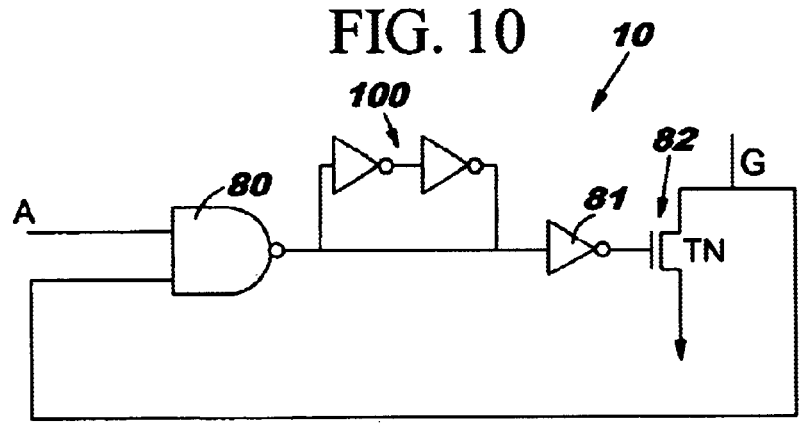
FIG. 10 is a schematic diagram of a pull-down booster according to the invention.
Figure 11:
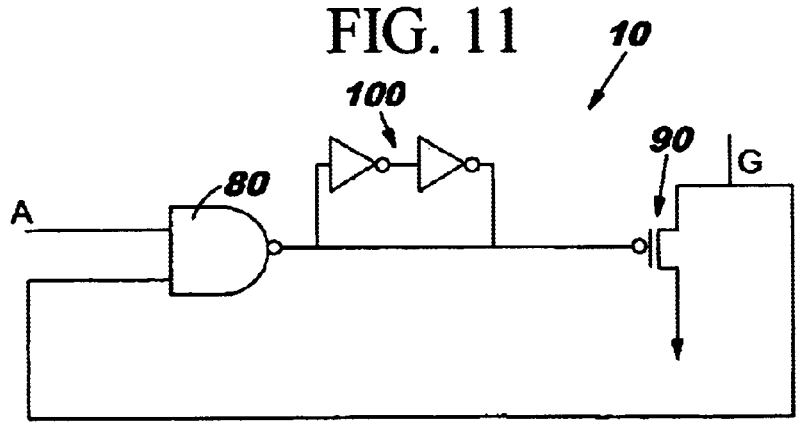
FIG. 11 is a schematic diagram of a pull-down booster according to the invention.

If the pull-down transistor comprises an N-type transistor 82 (as shown in FIGS. 8 and 10), the circuit further includes an inverter 81 positioned between the logical NAND device 80 and the pull-up transistor 82. To the contrary, if the pull-down transistor comprises a P-type transistor 90, as shown in FIGS. 9 and 11, the NAND device 83 is directly connected to the PFET 90. If the goal is for G to keep pulling down to zero quickly during the whole boost period, the invention uses the NFET 82 in FIG. 8. If the goal is for G to slowly pull down to zero, the invention uses the PFET 90 in FIG. 9. The PFET 90 passes a bad logic "0" below its threshold voltage (Vt) and stops passing a logic "0" when G reaches the threshold voltage of the PFET 90, which makes G pull down to zero more slowly than with the NFET 82 (which will remain conductive until the NAND device 80 shuts the NFET 82 off).

As shown in FIGS. 10 and 11, the invention can also provide at least one pull-down delay element (hystersis path) 100 between the logical NAND device 80 and the pull-down transistor 82, 90. By adding a hystersis path in the boost circuit, the invention has a prolonged period of time that the boost circuit is held on. The pull-down delay element(s) 100 is (are) connected in parallel with the signal line running between the logical NAND device 80 and the pull-down transistor 82, 90. This parallel arrangement provides that the delays created by the pull-down delay element(s) 100 are dynamically varied depending upon the difference between the voltage level at the input to the logical enable device 11, 40 and the voltage level at the gate of the driving transistor 12, 41.

As shown in FIGS. 12–15, the pull-up booster circuit 20 has a logical NOR device 120 having one input connected to the input signal A supplied to the logical enable device 11, 40. The pull-up booster circuit 20 also includes a pull-up transistor that has its gate connected to an output of the NOR device 120, a drain connected to an output G of the logical enable device 11, 40 (and the gate of the driving transistor), and a source connected to the higher logic "1" voltage level.

The second input of the logical NOR device 120 is connected to the gate of the driving transistor 12, 41 (G), such that the logical NOR device 120 dynamically activates the pull-up transistor to pull-up the gate of the driving transistor 12, 41 to higher voltage (e.g., a logical "1") only while the input signal A supplied to the logical enable device 11, 40 is at the second voltage level (e.g., a logical "0") and the signal on the output of the logical enable device 11, 40 G (and the gate of the driving transistor 12, 41) is also at the second voltage level (e.g., a logical "0") such that they are at the same logic level. Thus, initially, A=1, G=0 which means that the pull-up transistor is off. When input A switches from a logic "1" to a logic "0", there is a short period of time that A=0 and G=0. During this short period of time, the pull-up transistor is on and the pull-up transistor helps pull G up to logic "1". When G becomes a "1", the pull-up transistor turns off and the boost circuit is finished boosting.

Figure 12:
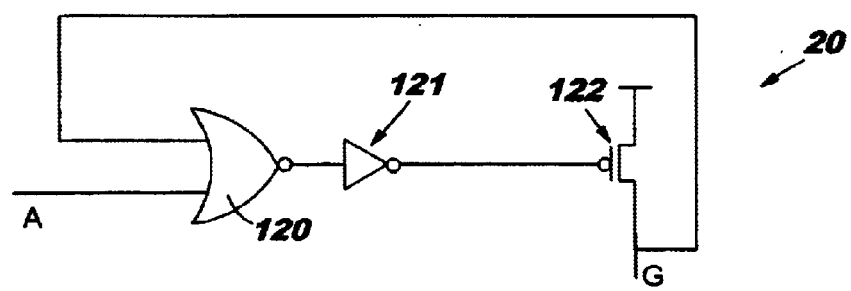
FIG. 12 is a schematic diagram of a pull-up booster according to the invention.
Figure 13:
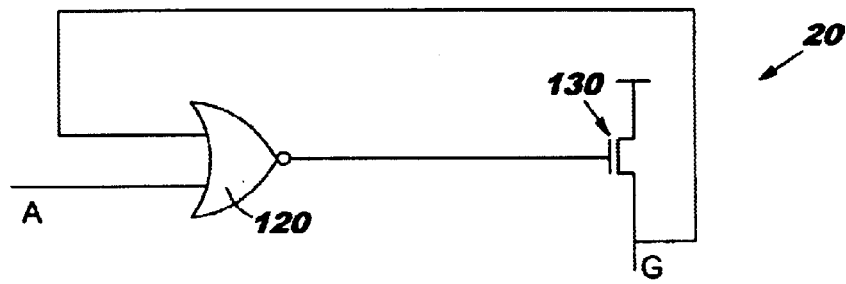
FIG. 13 is a schematic diagram of a pull-up booster according to the invention.
Figure 14:
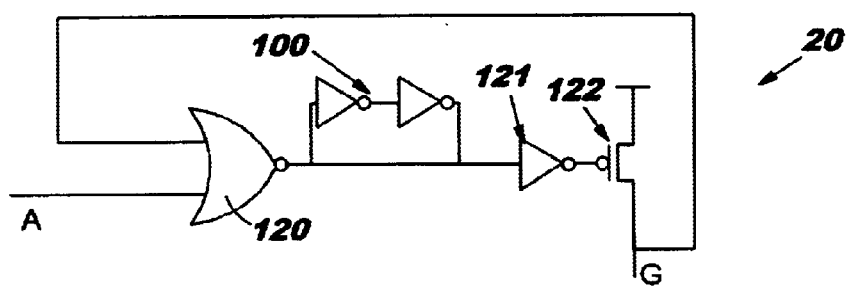
FIG. 14 is a schematic diagram of a pull-up booster according to the invention.

As with the pull-down circuit 10, if the pull-up transistor comprises a P-type transistor 122 (as shown in FIGS. 12 and 14), the circuit further includes an inverter 121 positioned between the logical NOR device 120 and the pull-up transistor 122. To the contrary, if the pull-up transistor comprises an N-type transistor 130, as shown in FIGS. 13 and 15, the NOR device 83 is directly connected to the PFET 90.

Figure 15:
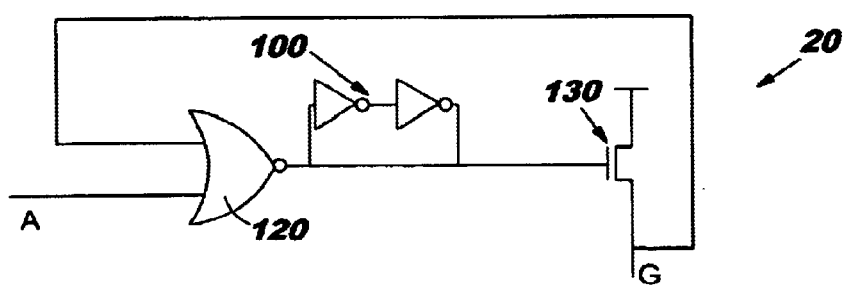
FIG. 15 is a schematic diagram of a pull-up booster according to the invention.

As shown in FIGS. 14 and 15, the invention can also provide at least one pull-up delay element 100 between the logical NOR device 120 and the pull-up transistor 122, 130. As discussed above, the pull-up delay element(s) 100 is (are) connected in parallel with the signal line running between the logical NOR device 120 and the pull-up transistor 122, 130, which provides that the delays created by the pull-up delay element(s) 100 are dynamically varied depending upon the difference between the voltage level at the input to the logical enable device 11, 40 and the voltage level at the gate of the driving transistor 12, 41.

Thus, as shown above, the invention begins with a driver circuit that includes a logical enable device and a driving transistor. In order to tighten slew rate and minimize delay skew, the invention adds a pull-down booster circuit connected to the gate of the driving transistor and/or a pull-up booster circuit connected to the gate of the driving transistor. The pull-down booster circuit is adapted to quickly start pulling down the voltage at the gate of the driving transistor when the voltage level at the input to the logical enable device changes from a first voltage (e.g., a logical "0") to a second higher voltage (e.g., a logical "1"). The pull-down booster than dynamically shuts itself off when the voltage level at feedback node G (the gate of the driving transistor) changes from a first voltage (e.g., a logical 1) to a second lower voltage (e.g. a logical 0). The voltage level at feedback node G (the gate of the driving transistor) only needs to fall to a threshold voltage below the voltage supply to start shutting off the pull-down booster. Thus, the stronger the pull-down booster circuit is, the faster it will shut itself off. This is why the pull-down boost circuit can be considered dynamic and sensitive to different process, temperature and voltage conditions. After the pull-down booster shuts off, the voltage level at the gate of the driving transistor is controlled by the logical enable device which controls the slew rate and di/dt by utilizing resistors in series with the CMOS FETS. By using only the resistors to control di/dt and slew rates, the circuit is adversely affected in terms of delay. By using the boost circuit in combination with the resistors, the invention is able to get a balance of delay, slew rate control, reduced di/dt, and less overshoot/undershoot voltage at the PAD. The pull-up booster circuit is adapted to dynamically pull-up the voltage at the gate of the driving transistor when the voltage level at the input to the logical enable device changes in the opposite direction.

While the invention has been described in terms of preferred embodiments, those skilled in the art will recognize that the invention can be practiced with modification within the spirit and scope of the appended claims.

What is claimed is:

1. A driver circuit comprising:
   a logical enable device having an input and an output;
   a driving transistor having a gate connected to said output of said logical enable device; and at least one of:
   a pull-down booster circuit connected to said gate of said driving transistor, wherein said pull-down booster circuit is adapted to dynamically pull-down a voltage at said gate of said driving transistor when a voltage level at said input to said logical enable device changes from a first voltage to a second voltage; and
   a pull-up booster circuit connected said gate of said driving transistor, wherein said pull-up booster circuit is adapted to dynamically pull-up a voltage at said gate of said driving transistor when a voltage level at said input to said logical enable device changes from said second voltage to said first voltage.

2. The driver circuit in claim 1, wherein said pull-down booster circuit comprises:
   a logical NAND device having first and second inputs, wherein said first input is connected to an input signal supplied to said logical enable device; and
   a pull-down transistor having a gate connected to an output of said NAND device, a source connected to said gate of said driving transistor, and a drain connected to ground.

3. The driver circuit in claim 2, wherein said second input of said logical NAND device is connected to said gate of said driving transistor, such that said logical NAND device dynamically activates said pull-down transistor to pull-down said gate of said driving transistor to ground only while said input signal is at said second voltage level and said gate of said driving transistor is also at said second voltage level.

4. The driver circuit in claim 2, further comprising at least one pull-down delay element between said logical NAND device and said pull-down transistor.

5. The driver circuit in claim 4, wherein said pull-down delay element is connected in parallel with a signal line running between said logical NAND device and said pull-down transistor such that a delay created by said pull-down delay element is dynamically varied depending a difference between a voltage level of said input signal supplied to said logical enable device and a voltage level at said gate of said driving transistor.

6. The driver circuit in claim 2, wherein said pull-down transistor comprises a P-type transistor directly connected to said logical NAND device.

7. The driver circuit in claim 2, wherein said pull-down transistor comprises an N-type transistor and said circuit further comprises an inverter positioned between said logical NAND device and said transistor.

8. The driver circuit in claim 1, wherein said pull-up booster circuit comprises:
   a logical NOR device having first and second inputs, wherein said first input is connected to an input signal supplied to said logical enable device; and
   a pull-up transistor having a gate connected to an output of said NOR device, a drain connected to said gate of said driving transistor, and a source connected to a first voltage level.

9. The driver circuit in claim 8, wherein said second input of said logical NOR device is connected to said gate of said driving transistor, such that said logical NOR device activates said pull-up transistor to pull-up said gate of said driving transistor to said first voltage level only while said input signal supplied to said logical enable device is at said first voltage level and said gate of said driving transistor is also at said first voltage level.

10. The driver circuit in claim 8, further comprising at least one pull-down delay element between said logical NOR device and said pull-down transistor.

11. The driver circuit in claim 10, wherein said pull-down delay element is connected in parallel with a signal line running between said logical NOR device and said pull-down transistor such that a delay created by said pull-down delay element is dynamically varied depending upon a difference between a voltage level of said input signal supplied to said logical enable device and a voltage level at said gate of said driving transistor.

12. The driver circuit in claim 8, wherein said transistor comprises an N-type transistor directly connected to said logical NOR device.

13. The driver circuit in claim 8, wherein said transistor comprises a P-type transistor and said circuit further comprises an inverter positioned between said logical NOR device and said transistor.

14. A driver circuit comprising:
   a logical enable device;
   a driving transistor having a gate connected to an output of said logical enable device; and
   a pull-down booster circuit comprising:
   a logical NAND device having first and second inputs, wherein said first input is connected to an input signal supplied to said logical enable device; and
   a pull-down transistor having a gate connected to an output of said NAND device, a source connected to said gate of said driving transistor, and a drain connected to ground,
   wherein said second input of said logical NAND device is connected to said gate of said driving transistor, such that said logical NAND device dynamically activates said pull-down transistor to pull-down said gate of said driving transistor to ground only while said input signal and said gate of said driving transistor are at the same logic level.

15. The driver circuit in claim 14, further comprising at least one pull-down delay element between said logical NAND device and said pull-down transistor.

16. The driver circuit in claim 15, wherein said pull-down delay element is connected in parallel with a signal line running between said logical NAND device and said pull-down transistor such that a delay created by said pull-down delay element is dynamically varied depending a difference between a voltage level of said input signal supplied to said logical enable device and a voltage level at said gate of said driving transistor.

17. The driver circuit in claim 14, wherein said pull-down transistor comprises a P-type transistor directly connected to said logical NAND device.

18. The driver circuit in claim 14, wherein said pull-down transistor comprises an N-type transistor and said circuit further comprises an inverter positioned between said logical NAND device and said transistor.

19. A driver circuit comprising:
   a logical enable device;
   a driving transistor having a gate connected to an output of said logical enable device; and
   a pull-up booster circuit comprising:
   a logical NOR device having first and second inputs, wherein said first input is connected to an input signal supplied to said logical enable device; and
   a pull-up transistor having a gate connected to an output of said NOR device, a drain connected to said gate of said driving transistor, and a source connected to a first voltage level,
   wherein said second input of said logical NOR device is connected to said gate of said driving transistor, such that said logical NOR device activates said pull-up transistor to pull-up said gate of said driving transistor to said first voltage level only while said input signal supplied to said logical enable and said gate of said driving transistor are at the same logic level.

20. The driver circuit in claim 19, further comprising at least one pull-down delay element between said logical NOR device and said pull-down transistor.

21. The driver circuit in claim 20, wherein said pull-down delay element is connected in parallel with a signal line running between said logical NOR device and said pull-down transistor such that a delay created by said pull-down delay element is dynamically varied depending a difference between a voltage level of said input signal supplied to said logical enable device and a voltage level at said gate of said driving transistor.

22. The driver circuit in claim 19, wherein said pull-down transistor comprises an N-type transistor directly connected to said logical NOR device.

23. The driver circuit in claim 19, wherein said pull-down transistor comprises a P-type transistor and said circuit further comprises an inverter positioned between said logical NOR device and said transistor.

24. A driver circuit comprising:
   a logical enable device;
   a driving transistor having a gate connected to an output of said logical enable device;
   a pull-down booster circuit comprising:
   a logical NAND device having first and second inputs, wherein said first input is connected to an input signal supplied to said logical enable device; and
   a pull-down transistor having a gate connected to an output of said NAND device, a source connected to said gate of said driving transistor, and a drain connected to ground,
   wherein said second input of said logical NAND device is connected to said gate of said driving transistor, such that said logical NAND device dynamically activates said pull-down transistor to pull-down said gate of said driving transistor to ground only while said input signal and said gate of said driving transistor are both at a first logic level; and a pull-up booster circuit comprising:
  a logical NOR device having first and second inputs, wherein said first input is connected to an input signal supplied to said logical enable device; and
  a pull-up transistor having a gate connected to an output of said NOR device, a drain connected to said gate of said driving transistor, and a source connected to a first voltage level,
  wherein said second input of said logical NOR device is connected to said gate of said driving transistor, such that said logical NOR device activates said pull-up transistor to pull-up said gate of said driving transistor to said first voltage level only while said input signal supplied to said logical enable and said gate of said driving transistor are both at a second logic level.

25. The driver circuit in claim 24, further comprising at least one pull-down delay element between said logical NAND device and said pull-down transistor and at least one pull-up delay element between said logical NOR device and said pull-up transistor.

26. The driver circuit in claim 25, wherein said pull-down delay element is connected in parallel with a signal line running between said logical NAND device and said pull-down transistor and said pull-up delay element is connected in parallel with a signal line running between said logical NOR device and said pull-up transistor, such that delays created by said pull-down delay element and said pull-up delay element are dynamically varied depending a difference between a voltage level of said input signal supplied to said logical enable device and a voltage level at said gate of said driving transistor.

27. The driver circuit in claim 24, wherein said pull-down transistor comprises a P-type transistor directly connected to said logical NAND device and said pull-up transistor comprises a N-type transistor directly connected to said logical NOR device.

28. The driver circuit in claim 24, wherein said pull-down transistor comprises an N-type transistor and said circuit further comprises an inverter positioned between said logical NAND device and said pull-up transistor and wherein said pull-up transistor comprises a P-type transistor and said circuit further comprises and inverter positioned between said logical NOR device and said pull-up transistor.

29. A pull-down booster circuit for use with a driver having a logical enable device, said pull-down booster circuit comprising:
  a logical NAND device having first and second inputs, wherein said first input is connected to an input signal supplied to said logical enable device; and
  a transistor having a gate connected to an output of said NAND device, a source connected to an output of said logical enable device, and a drain connected to ground,
  wherein said second input of said logical NAND device is connected to said output of said logical enable device, such that said logical NAND device dynamically activates said transistor to pull-down said output of said logical enable device to ground only while said input signal and a signal on said output of said logical enable device are at the same logic level.

30. The pull-down booster circuit in claim 29, further comprising at least one pull-down delay element between said logical NAND device and said transistor.

31. The pull-down booster circuit in claim 30, wherein said pull-down delay element is connected in parallel with a signal line running between said logical NAND device and said transistor such that a delay created by said pull-down delay element is dynamically varied depending upon a difference between a voltage level of said input the signal supplied to said logical enable device and a voltage level at said output of said logical enable device.

32. The pull-down booster circuit in claim 29, wherein said transistor comprises a P-type transistor directly connected to said logical NAND device.

33. The pull-down booster circuit in claim 29, wherein said transistor comprises an N-type transistor and said circuit further comprises an inverter positioned between said logical NAND device and said transistor.

34. A pull-up booster circuit for use with a driver having a logical enable device, said pull-up booster circuit comprising:
  a logical NOR device having first and second inputs, wherein said first input is connected to an input signal supplied to said logical enable device; and
  a transistor having a gate connected to an output of said NOR device, a drain connected to an output of said logical enable device, and a source connected to a first voltage level,
  wherein said second input of said logical NOR device is connected to said output of said logical enable device, such that said logical NOR device activates said transistor to pull-up said output of said logical enable device to said first voltage level only while said input signal supplied to said logical enable device and a signal on said output of said logical enable device at are at the same logic level.

35. The pull-up booster circuit in claim 34, further comprising at least one pull-down delay element between said logical NOR device and said transistor.

36. The pull-up booster circuit in claim 35, wherein said pull-down delay element is connected in parallel with a signal line running between said logical NOR device and said transistor such that a delay created by said pull-down delay element is dynamically varied depending upon a difference between a voltage level of said input the signal supplied to said logical device and a voltage level at said output of said logical enable device.

37. The pull-up booster circuit in claim 34, wherein said transistor comprises an N-type transistor directly connected to said logical NOR device.

38. The pull-up booster circuit in claim 34, wherein said transistor comprises a P-type transistor and said circuit further comprises an inverter positioned between said logical NOR device and said transistor.

* * * * *